US012129554B2

(12) United States Patent
Bews et al.

(10) Patent No.: US 12,129,554 B2
(45) Date of Patent: Oct. 29, 2024

(54) BI-LAYER PROTECTIVE COATINGS FOR METAL COMPONENTS

(71) Applicant: Callidus Process Solutions Pty Ltd, Balcatta (AU)

(72) Inventors: Duncan Bews, Balcatta (AU); Robert Smith, Balcatta (AU); Evelyn Ng, Balcatta (AU)

(73) Assignee: Callidus Process Solutions Pty Ltd., Balcatta (AU)

( * ) Notice: Subject to any disclaimer, the term of this patent is extended or adjusted under 35 U.S.C. 154(b) by 0 days.

(21) Appl. No.: 17/778,485

(22) PCT Filed: Nov. 6, 2020

(86) PCT No.: PCT/IB2020/060444
§ 371 (c)(1),
(2) Date: May 20, 2022

(87) PCT Pub. No.: WO2021/099873
PCT Pub. Date: May 27, 2021

(65) Prior Publication Data
US 2023/0002911 A1    Jan. 5, 2023

(30) Foreign Application Priority Data

Nov. 21, 2019    (AU) ................................ 2019904402

(51) Int. Cl.
*C23C 28/00*    (2006.01)
*B32B 15/04*    (2006.01)
(Continued)

(52) U.S. Cl.
CPC ............ *C23C 28/322* (2013.01); *B32B 15/04* (2013.01); *B32B 15/043* (2013.01); *B32B 15/16* (2013.01);
(Continued)

(58) Field of Classification Search
CPC ....... C23C 28/322; C23C 28/32; C23C 28/34; C23C 28/341; C23C 28/3445;
(Continued)

(56) References Cited

U.S. PATENT DOCUMENTS 5,851,678 A  * 12/1998  Hasz ...................... C04B 35/01
                                                           428/689
8,512,874 B2 *  8/2013  Darolia .................. C23C 10/48
                                                           420/447
(Continued)

FOREIGN PATENT DOCUMENTS

KR    102010-0061854      6/2010
WO    WO 2011/159238     12/2011
WO    WO-2019161981 A1 *  8/2019  ........... C23C 28/322

OTHER PUBLICATIONS

International Search Report and Written Opinion dated Feb. 19, 2021 for International Application PCT/IB2020/060444 filed Nov. 6, 2020 (8 pages).

(Continued)

*Primary Examiner* — Michael E. La Villa
(74) *Attorney, Agent, or Firm* — FisherBroyles, LLP; Cara L. Crowley-Weber; Gregory T. Fettig

(57) ABSTRACT

A bi-layer protective coating for a metal component, the bi-layer protective coating comprising a bond coating that is metallurgically fused to a substrate of the metal component, wherein the bond coating comprises one or more rare metals and a top coating that is mechanically bonded to the bond coating, wherein the top coating comprises one or more metal oxides, or one or more metal carbides.

6 Claims, 10 Drawing Sheets

(51) Int. Cl.
| | |
|---|---|
| *B32B 15/16* | (2006.01) |
| *B32B 18/00* | (2006.01) |
| *C23C 4/02* | (2006.01) |
| *C23C 4/10* | (2016.01) |
| *C23C 4/11* | (2016.01) |
| *C23C 4/134* | (2016.01) |
| *C23C 4/137* | (2016.01) |
| *C23C 4/18* | (2006.01) |
| *C23C 16/06* | (2006.01) |
| *C23C 30/00* | (2006.01) |
| *C25D 3/66* | (2006.01) |
| *F01D 5/28* | (2006.01) |
| *F01D 25/00* | (2006.01) |
| *F16K 25/00* | (2006.01) |
| *F16K 47/00* | (2006.01) |

(52) U.S. Cl.
CPC ............... *B32B 18/00* (2013.01); *C23C 4/02* (2013.01); *C23C 4/10* (2013.01); *C23C 4/11* (2016.01); *C23C 4/134* (2016.01); *C23C 4/137* (2016.01); *C23C 4/18* (2013.01); *C23C 16/06* (2013.01); *C23C 28/32* (2013.01); *C23C 28/321* (2013.01); *C23C 28/3215* (2013.01); *C23C 28/324* (2013.01); *C23C 28/34* (2013.01); *C23C 28/341* (2013.01); *C23C 28/345* (2013.01); *C23C 28/3455* (2013.01); *C23C 28/347* (2013.01); *C23C 30/00* (2013.01); *C23C 30/005* (2013.01); *C25D 3/66* (2013.01); *F01D 5/28* (2013.01); *F01D 5/282* (2013.01); *F01D 5/284* (2013.01); *F01D 5/288* (2013.01); *F01D 25/005* (2013.01); *F16K 25/005* (2013.01); *F16K 47/00* (2013.01); *Y10T 428/12576* (2015.01); *Y10T 428/12597* (2015.01); *Y10T 428/12604* (2015.01); *Y10T 428/12611* (2015.01); *Y10T 428/12618* (2015.01); *Y10T 428/1266* (2015.01); *Y10T 428/12667* (2015.01); *Y10T 428/12771* (2015.01); *Y10T 428/12785* (2015.01); *Y10T 428/12806* (2015.01); *Y10T 428/12812* (2015.01); *Y10T 428/12819* (2015.01); *Y10T 428/12826* (2015.01); *Y10T 428/1284* (2015.01); *Y10T 428/12861* (2015.01); *Y10T 428/12868* (2015.01); *Y10T 428/12931* (2015.01); *Y10T 428/12937* (2015.01); *Y10T 428/12944* (2015.01); *Y10T 428/12951* (2015.01); *Y10T 428/12972* (2015.01); *Y10T 428/12979* (2015.01); *Y10T 428/12993* (2015.01)

(58) Field of Classification Search
CPC . C23C 28/321; C23C 28/3215; C23C 28/324; C23C 28/345; C23C 28/347; C23C 30/00; C23C 30/005; C23C 4/02; C23C 4/10; C23C 4/18; C23C 4/11; C23C 4/134; C23C 4/137; C23C 16/06; C25D 3/66; F16K 25/005; F16K 47/00; F01D 5/28; F01D 5/282; F01D 5/284; F01D 5/288; F01D 25/005; B32B 15/04; B32B 15/043; B32B 15/16; B32B 18/00; Y10T 428/12931; Y10T 428/12972; Y10T 428/12979; Y10T 428/12993; Y10T 428/12806; Y10T 428/12812; Y10T 428/12819; Y10T 428/12826; Y10T 428/1284; Y10T 428/12937; Y10T 428/12944; Y10T 428/42951; Y10T 428/12785; Y10T 428/12771; Y10T 428/12861; Y10T 428/12868; Y10T 428/12576; Y10T 428/12597; Y10T 428/12604; Y10T 428/12611; Y10T 428/12618; Y10T 428/1266; Y10T 428/12667

See application file for complete search history.

(56) References Cited

U.S. PATENT DOCUMENTS

| | | | |
|---|---|---|---|
| 9,011,667 B2* | 4/2015 | Abd Elhamid | H01M 8/023 |
| | | | 205/322 |
| 2005/0079368 A1 | 4/2005 | Gorman et al. | |
| 2007/0098987 A1* | 5/2007 | Huddleston | C23C 4/06 |
| | | | 428/402 |
| 2013/0255881 A1 | 10/2013 | Mitsuhashi et al. | |
| 2016/0160322 A1 | 6/2016 | Kuhn et al. | |
| 2017/0030204 A1 | 2/2017 | Gorokhovsky | |
| 2020/0407856 A1* | 12/2020 | Guenther | C23C 28/347 |

OTHER PUBLICATIONS

Communication pursuant to Rule 114(2) EPC from Application No. 20888761.2 dated Jul. 31, 2024.
Mugabi (2014) "The Chemical Vapour Deposition of Tantalum - in long narrow channels" Department of Energy Conversion and Storage, Technical University of Denmark 127 pages.
Williams et al. (2004) "Ball valves with nanostructured titanium oxide coatings for high-pressure acid-leach service: development to application" Research Gate 19 pages.

\* cited by examiner

BI-LAYER PROTECTIVE COATINGS FOR METAL COMPONENTS

FIELD

The present invention relates to bi-layer protective coatings for metal components.

BACKGROUND

In a variety of industrial processes, metal components, such as but not limited to valves, are subject to high temperature and pressure, and highly corrosive and erosive environments.

Examples of such processes include but are not limited to autoclave processes for pressure oxidation (POX) and high pressure acid leaching (HPAL) of slurried ores and concentrates. In many processes, maintenance and downtime associated with wear and corrosion failure of metal components can be substantial.

Conventional single-layer protective coatings, such as prior art single oxide coatings, for metal components provide wear resistance but are very sensitive to corrosion induced failure and delamination.

In view of this background, a need exists for improved protective coatings for metal components having increased resistance against corrosion, wear, erosion, and delamination.

SUMMARY

According to the present invention, there is provided a bi-layer protective coating for a metal component, the bi-layer protective coating comprising:

a bond coating that is metallurgically fused to a substrate of the metal component, wherein the bond coating comprises one or more rare metals; and a top coating that is mechanically bonded to the bond coating, wherein the top coating comprises one or more metal oxides, or one or more metal carbides.

The bond coating may be metallurgically fused to the substrate by one or more of chemical vapour deposition, molten salt electrodeposition, and fusion welding.

The bond coating may be fully dense or substantially fully dense.

The top coating may be mechanically bonded to the bond coating by thermal spraying of one or both of nanometer and micrometer size particles.

The bond coating may comprise one or more rare metals selected from the group consisting of zirconium, vanadium, niobium, and tantalum.

The top coating may comprise one or more metal oxides selected from the group consisting of titanium oxide (TiOx), chromium oxide (CrOx), silicon oxide (SiOx), and titanium oxide-chromium oxide (TiOx-CrOx).

Alternatively, the top coating may comprise one or more metal carbides selected from the group consisting of tungsten carbide (WC), chrome carbide (CrC), and chrome carbide-tungsten carbide (CrC—WC).

The top coating may be densified after mechanical bonding to the bond coating.

The bond coating may at least partially provide corrosion resistance to the substrate.

The top coating may at least partially provide wear and erosion resistance to the bond coating.

The present invention further provides a method for forming a bi-layer protective coating on a metal component, the method comprising the steps of:

metallurgically fusing a bond coating to a substrate of the metal component, wherein the bond coating comprises one or more rare metals; and mechanically bonding a top coating to the bond coating, wherein the top coating comprises one or more metal oxides, or one or more metal carbides.

The method may further comprise densifying the top coating after mechanically bonding to the bond coating.

The present invention also provides a metal component coated with the above bi-layer protective coating, or coated using the above method.

BRIEF DESCRIPTION OF DRAWINGS

Embodiments of the invention will now be described by way of example only with reference to the accompanying drawings, in which.

DESCRIPTION OF EMBODIMENTS

Figure 1:
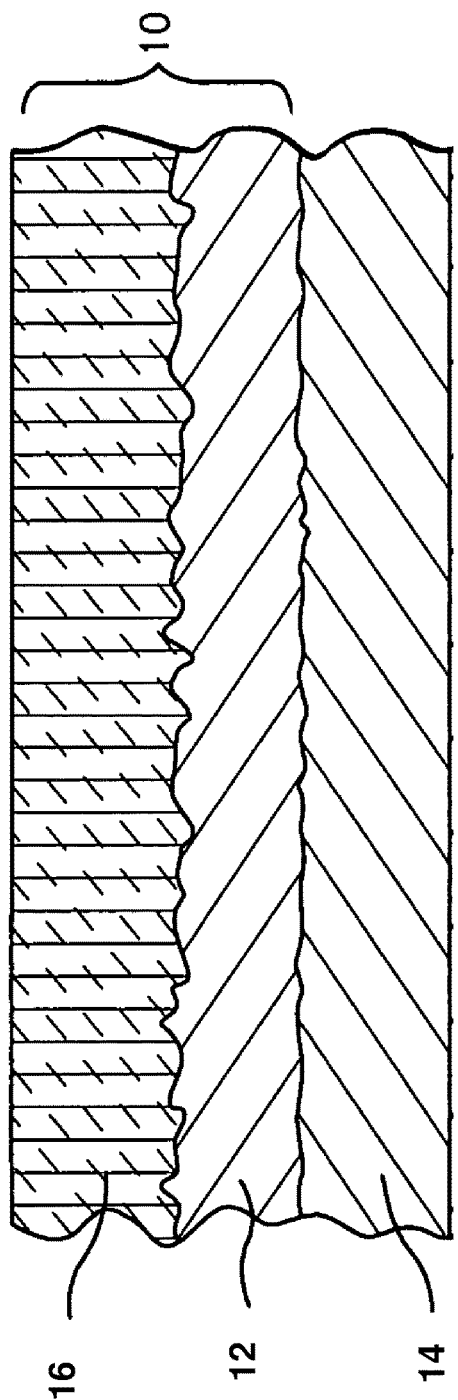
FIG. 1 is a schematic cross-section view of a metal component showing a bi-layer protective coating according to an embodiment of the present invention.

Referring to the drawings, a bi-layer protective coating 10 for a metal component according to an embodiment of the present invention may generally comprise a bond coating 12 that is metallurgically fused (or metallurgically adhered) to a substrate 14 of the metal component 10, and a top coating 16 that is mechanically bonded (or mechanically adhered) to the underlying bond coating 12.

The bond coating 12 may comprise one or more rare metals that are, for example, selected from the group consisting of zirconium, vanadium, niobium, and tantalum. Other alternative or equivalent rare metals may also be used.

The bond coating 12 may be metallurgically fused to the substrate 14 by, for example, one or more of chemical vapour deposition, molten salt electrodeposition, and fusion welding. Other alternative or equivalent techniques for metallurgically fusing the bond coating 12 to the substrate 14 may also be used. The microstructure of the bond coating 12 may be fully dense, or substantially fully dense, with no void space or cracks, or substantially no void space or cracks, creating a uniform, coherent and hermetic (or sealing) coating layer on the underlying substrate 14. The full density (ie, 0% porosity), or substantially full density (ie, ~0% porosity), of the bond coating 12 may be achieved by selectively controlling the process conditions of the above techniques for applying the bond coating 12 to the underlying substrate 14.

The top coating 16 may comprise one or more metal oxides, or one or more metal carbides. The one or more metal oxides may, for example, be selected from the group consisting of titanium oxide (TiOx), chromium oxide (CrOx), silicon oxide (SiOx), and titanium oxide-chromium oxide (TiOx-CrOx). Alternatively, the one or more metal carbides may, for example, be selected from the group consisting of tungsten carbide (WC), chrome carbide (CrC), and chrome carbide-tungsten carbide (CrC—WC). Other alternative or equivalent wear and erosion resistant top coatings may also be used.

For example, the top coating 16 may comprise selected nanocomposite coatings comprising nanostructured materials combined with a matrix of a metal or metal alloy that provides improved wear and erosion resistance. Examples of suitable nanocomposites in a metal carbide or metal oxide matrix may include: tungsten-carbide (WC) nanometer size grains in a tungsten-carbide-cobalt (WC—Co) matrix; aluminium-silicon nanometer size grains and carbon nanotubes in an aluminum-silicon (Al—Si) alloy matrix; and carbon nanotubes in an aluminum-oxide (Al2O3) matrix/micrometer size powder particles.

The top coating 16 may be mechanically bonded to the bond coating by thermal spraying of one or both of nanometer and micrometer size particles. The thermal spraying may, for example, comprise one or more thermal spraying techniques selected from combustion, electrical discharge, cold spraying, and laser. Examples of such techniques include powder flame spraying, atmospheric plasma spraying APS, and high velocity oxygen fuel spraying (HVOF). For example, in the case of nanometer size particles, they may be sprayed by solution or suspension plasma-spraying. Other alternative or equivalent thermal spray techniques may also be used.

The top coating 16 may be densified after mechanical bonding to the bond coating 12. For example, the top coating 16 may be densified by, for example, applying a sealant onto the thermal spray surface to fill pores and cracks in order to make the top coating 16 more dense. Other alternative or equivalent densification techniques may also be used.

The bond coating 12 may, for example, have a thickness of 5 to 100 μm, for example, 30 to 70 μm. The top coating 16 may, for example, have a thickness of 100 to 900 μm, for example, 200 to 750 μm. The top coating 16 may, for example, have a bond or shear strength of greater than or equal to 6,000 PSI, and a hardness of greater than or equal to 700 HV0.5.

In use, the bond coating 12 may at least partially provide corrosion resistance to the substrate 14, and the top coating 16 may at least partially provide wear and erosion resistance to the bond coating 12.

The metal component may, for example, be used in an industrial process, such as but not limited to, an autoclave process, such as but not limited to HPAL or POX. The metal component may, for example, comprise a valve component. It will be appreciated, however, that embodiments of the invention are not limited to metal components, such as valve components used in autoclave processes, but may be alternatively implemented to coat any and all metal components used in any and all industrial processes that require increased resistance against corrosion, wear, and erosion.

The following Example is intended to illustrate the invention. It is not intended to limit the scope of the invention.

Example—Post-Service Comparison of Single- and Bi-Layer Coated Valve Trim

Prior Art Single Oxide Coated Valve Trim

In this example, "valve trim" collectively refers to a set of internal metal parts in a ball valve comprising a ball having two sides, and two seats on opposite sides of the ball. Prior to service, one set of valve trim parts was coated with a prior art single oxide coating. The prior art single coated valve trim was then installed in service in a ball valve used in a high temperature and pressure, and highly corrosive and erosive environment of an industrial process. The prior art single oxide coated valve trim was removed from service after 62 days in-line due to loss of sealing efficiency. Post-service inspections of the prior art single oxide coated parts were then conducted as follows.

Figure 2A:
FIGS. 2A and 2B are photographs of post-service inspections of opposite sides of a ball of a ball valve coated with a prior art single oxide coating.
Figure 2B:

FIGS. 2A and 2B are photographs of post-service inspections of opposite sides of the ball coated with the prior art single oxide coating. Both sides of the prior art single oxide coated ball are highly corroded. There is a large build-up of corrosion products on the surface of each side, and a majority of prior art single oxide coating has delaminated from both sides.

Figure 3A:
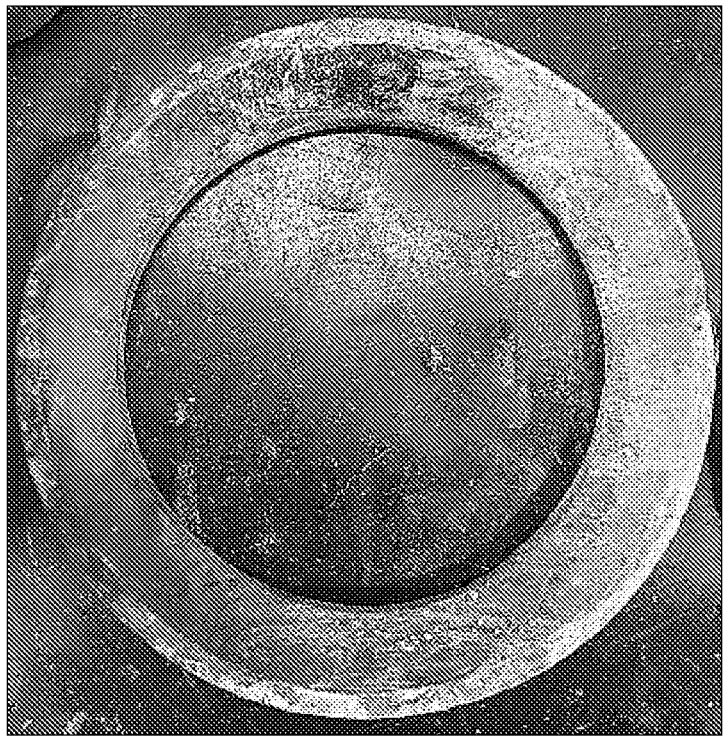
FIGS. 3A and 3B are photographs of post-service inspections of prior art single oxide coated seats on opposite sides of the ball of FIGS. 2A and 2B.
Figure 3B:
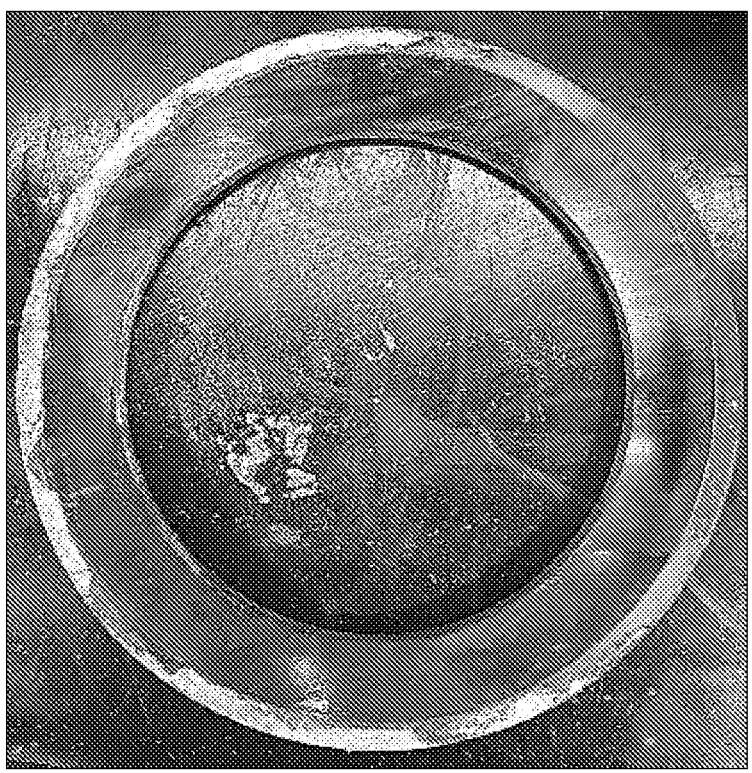

FIGS. 3A and 3B are photographs of post-service inspections of the prior art single oxide coated seats on opposite sides of the ball of FIGS. 2A and 2B. The prior art single oxide coating has delaminated in large regions of each seat. Corrosion is present in large regions of both seats where the prior art single oxide coating has delaminated, and there is a build-up of corrosion products on all surfaces of both seats. Markings traveling in same direction on the seats indicate wear pattern from the ball when it is rotated in the seats between open and closed positions.

Figure 4:
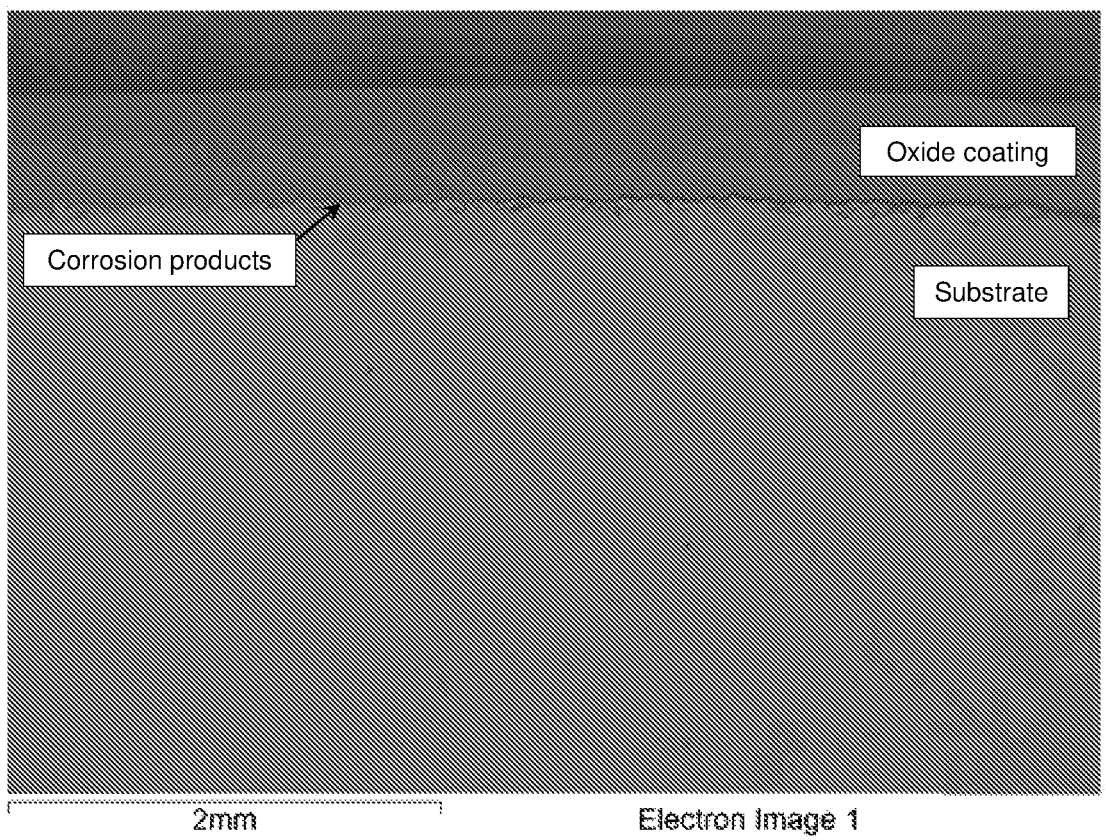
FIG. 4 is a post-service SEM micrograph of the cross-section of the prior art single oxide coating on the substrate of the ball.

FIG. 4 is a post-service SEM micrograph of the cross-section of the prior art single oxide coating on the substrate of the ball. The service medium has contacted the substrate via the inherent porosity in the prior art single oxide coating, and corrosion of the substrate was initiated. There is a significant build-up of corrosion products in the interface between the prior art single oxide coating and the substrate of the ball resulting in coating delamination.

Figure 5:
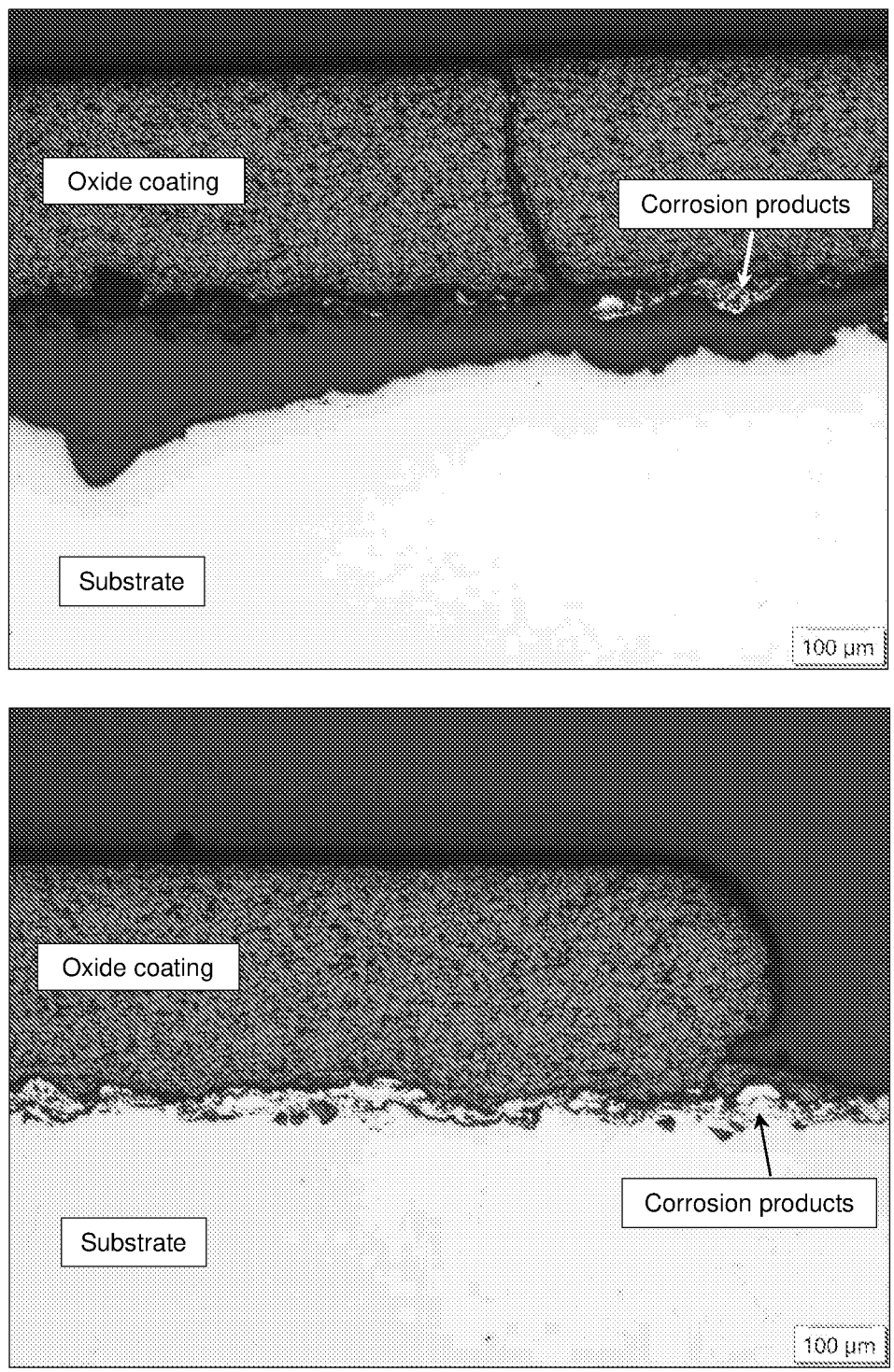
FIG. 5 are post-service optical micrographs of the cross-section of the prior art single oxide coating showing delamination from the substrate of the ball.

FIG. 5 are post-service optical micrographs of the cross-section of the prior art single oxide coating showing delamination of the prior art single oxide coating from the substrate of the ball. There is a significant build-up of corrosion products along the interface between the substrate and the prior art single oxide coating, and evidence of substrate material loss (ie, corrosion) resulting in the delamination and fracture of the prior art single oxide coating.

Figure 6:
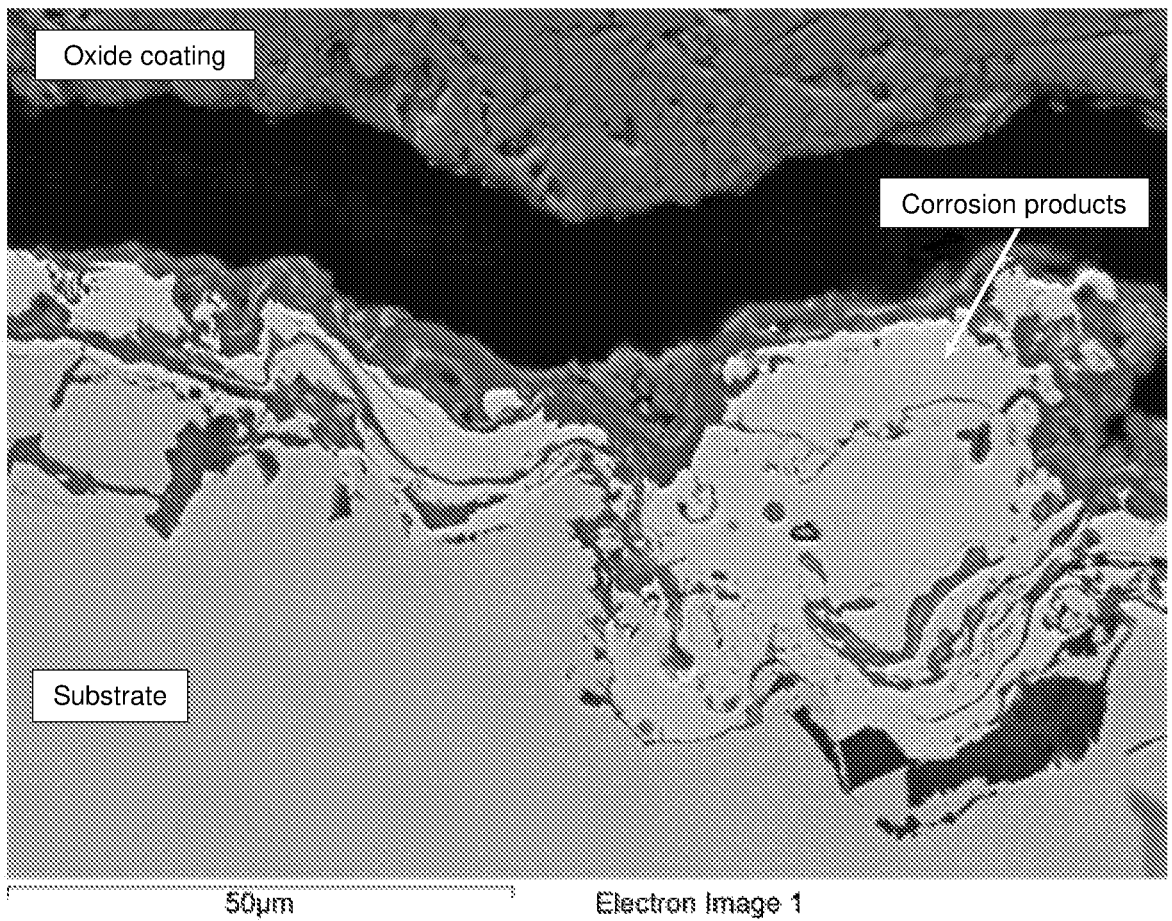
FIG. 6 is a post-service SEM micrograph of the cross-section microstructural morphology at the interface between the prior art single oxide coating and the substrate of the ball.

FIG. 6 is a post-service SEM micrograph of the cross-section microstructural morphology at the interface between the prior art single oxide coating and the underlying substrate of the ball. There is a significant build-up of corrosion products on the substrate, and the prior art single oxide coating has delaminated due to loss of mechanical interlock with the corroding substrate.

Bi-Layer Coated Valve Trim

Prior to service, another set of the same valve trim parts was coated with a bi-layer coating comprising a bond coating and a top coating of the present invention as described above. The bi-layer coated valve trim was then trialed in a ball valve used in the same industrial process as the prior art single oxide coated valve trim described above. The bi-layer coated valve trim was subjected to the same extreme service conditions as the prior art single oxide coated valve trim described above. The bi-layer coated valve trim was removed after 310 days in-line for post-service inspection to evaluate the success of the trial, and to compare the service performance of the bi-layer coated valve trim with the prior art single oxide coated valve trim described above. Post-service inspections of the bi-layer coated parts were then conducted as follows.

Figure 7A:
FIGS. 7A and 7B are photographs of post-service inspections of opposite sides of a ball of a ball valve coated with an example bi-layer coating of the present invention.
Figure 7B:

FIGS. 7A and 7B are photographs of post-service inspections of opposite sides of the ball coated with the bi-layer coating of the present invention. There is no visible corrosion on the sealing surfaces on both sides of the ball. The top oxide coating of the bi-layer coating is intact, with only minor scale deposits present on the surface of the top coating of the bi-layer coating.

Figure 8A:
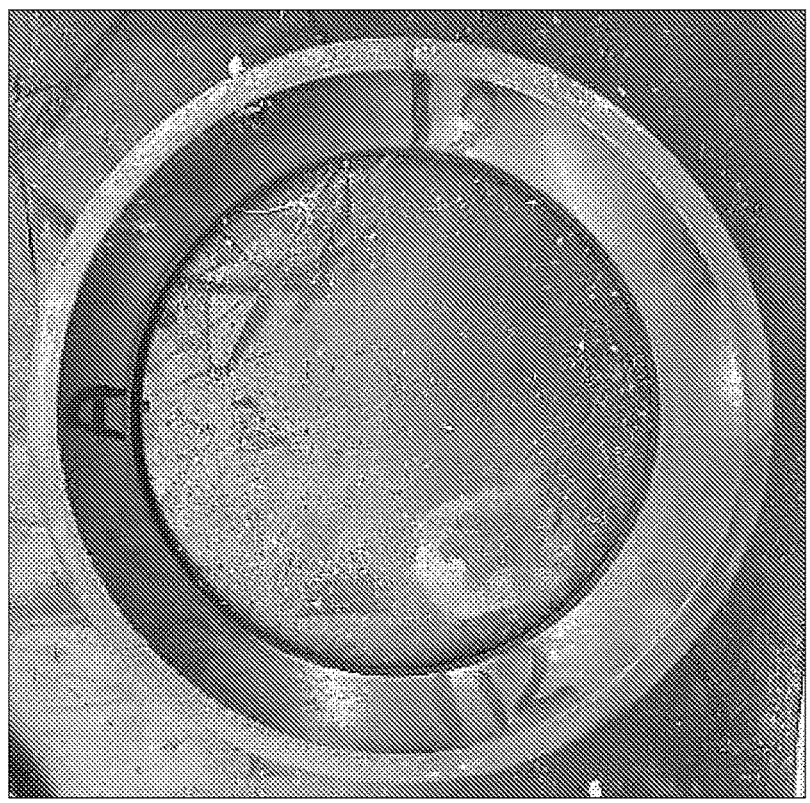
FIGS. 8A and 8B are photographs of post-service inspections of bi-layer coated seats on opposite sides of the bi-layer coated ball of FIGS. 7A and 7B.
Figure 8B:
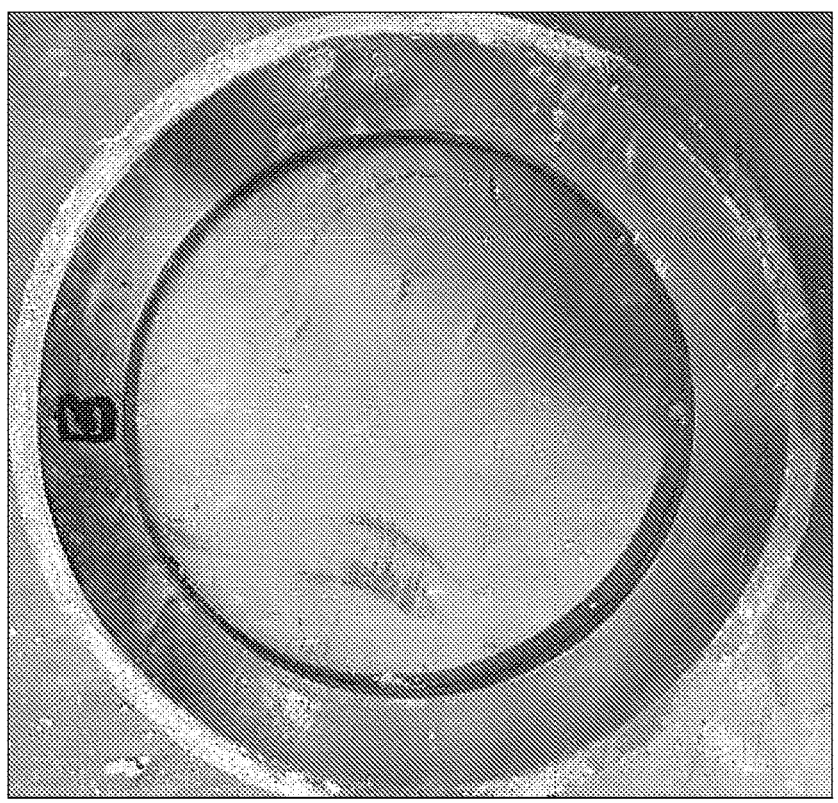

FIGS. 8A and 8B are photographs of post-service inspections of bi-layer coated seats on opposite sides of the bi-layer coated ball of FIGS. 7A and 7B. The top coating of the bi-layer coating remained in excellent condition with only small coating chipping at the outer edge of the sealing surfaces of the seats.

Figure 9:
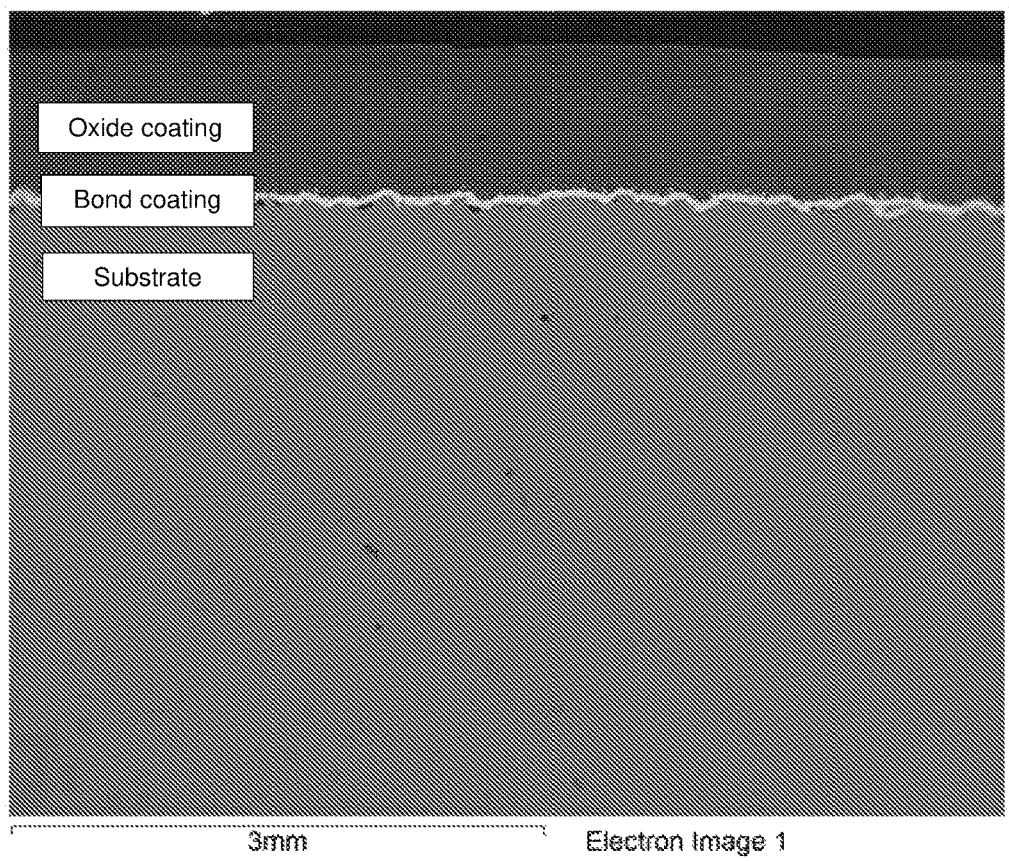
FIGS. 9 and 10 are respective low and high magnification post-service SEM micrographs of cross-section microstructural morphology and composition of the bond coating and top coating layers at the interface between the bi-layer coating and the substrate of the bi-layer coated ball.
Figure 10:
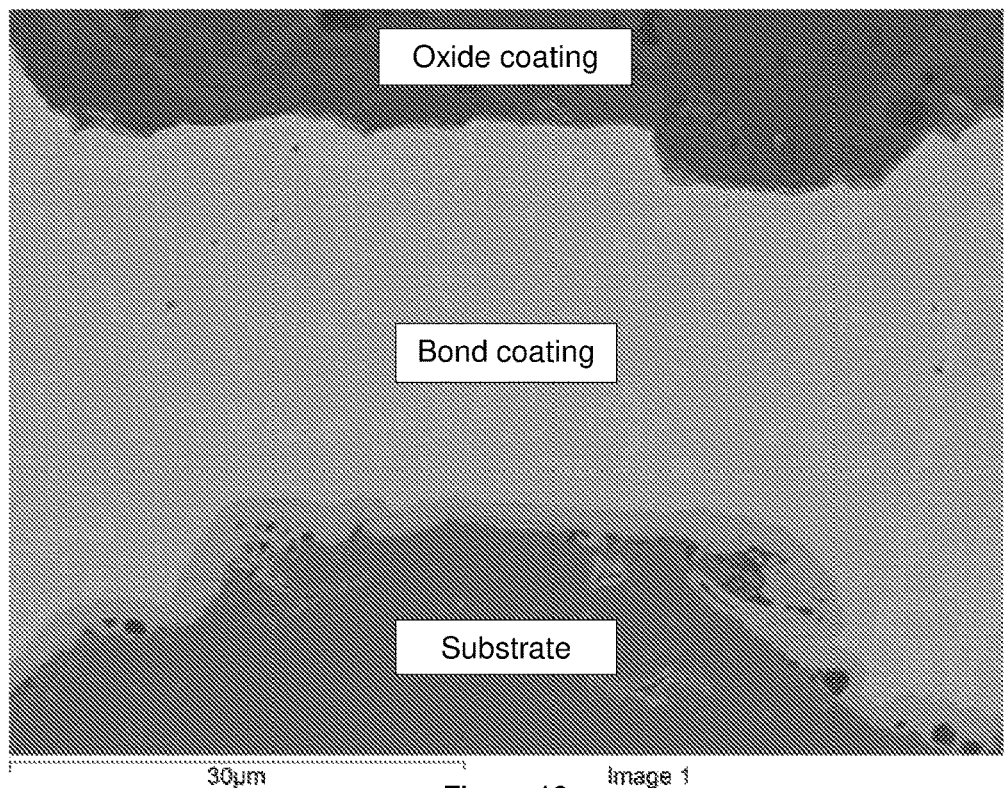

FIGS. 9 and 10 are respective low and high magnification post-service SEM micrographs of cross-section microstructural morphology and composition of the bond coating and top coating layers at the interface between the bi-layer coating and the substrate of the bi-layer coated ball. A metallurgical bond between the bond coating of the bi-layer coating and the underlying substrate remained with no evidence of substrate corrosion, while the top oxide coating of the bi-layer coating remained intact and bonded to the underlying bond coating.

Figure 11:
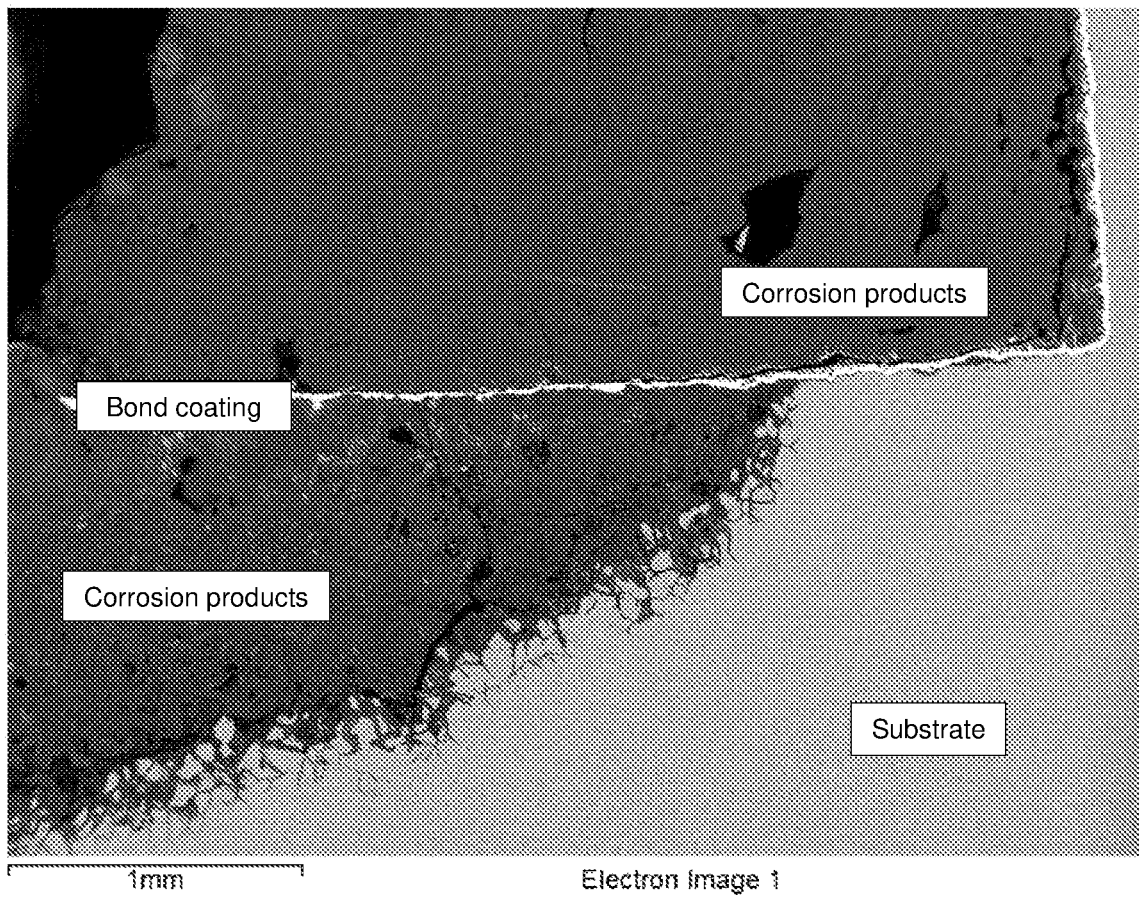
FIG. 11 is a post-service SEM micrograph of cross-section microstructural morphology at a stem slot region of the bi-layer coated ball of FIGS. 7A and 7B where only the bond coating of the bi-layer coating was applied (ie, no top coating of the bi-layer coating was applied).

FIG. 11 is a post-service SEM micrograph of cross-section microstructural morphology at a stem slot region of the bi-layer coated ball of FIGS. 7A and 7B where only the bond coating alone of the bi-layer coating was applied (ie, no top coating of the bi-layer coating was applied). The bond coating alone was easily breached when mechanical forces or loading were applied. Extensive corrosion of the substrate occurred, evident by the build-up of corrosion products between the substrate and bond coating, and extensive intergranular and transgranular cracking in the substrate.

The above post-service comparisons of the prior art single coated valve trim and the bi-layer coated valve trim show that there is unexpected synergy between the bond coating and the top coating of the bi-layer coating of the present invention, as shown by the increased resistance against corrosion, wear, erosion, and coating delamination of the bi-layer coated valve trim when compared to the prior art single oxide coated valve trim, or to the bond coating alone of the bi-layer coating (ie, without the top coating of the bi-layer coating).

Embodiments of the present invention provide bi-layer protective coatings that are both specifically and generally useful for providing metal components with simultaneous resistance against corrosion, wear, and erosion.

For the purpose of this specification, the word "comprising" means "including but not limited to," and the word "comprises" has a corresponding meaning.

The above embodiments have been described by way of example only and modifications are possible within the scope of the claims that follow.

The invention claimed is:

1. A bi-layer coating on a substrate of a metal component, the bi-layer coating comprising:
   a first layer that is metallurgically fused to the substrate and which comprises one or more of zirconium, vanadium, niobium, and tantalum; and
   a second layer that is mechanically bonded to the first layer and which comprises one or more oxides of titanium, chromium, or silicon, or one or more carbides of tungsten or chrome, wherein the metal component comprises a valve trim part of a ball valve for use in a corrosive environment of a high-pressure acid leaching (HPAL) or pressure oxidation (POX) hydrometallurgical process.

2. The bi-layer coating of claim 1, wherein the first layer at least partially provides corrosion resistance to the substrate.

3. The bi-layer coating of claim 1, wherein the second layer at least partially provides wear and erosion resistance to the first layer.

4. The bi-layer coating of claim 1, wherein the first layer is metallurgically fused to the substrate by one or more of chemical vapour deposition, molten salt electrodeposition, and fusion welding.

5. The bi-layer coating of claim 1, wherein the second layer is mechanically bonded to the first layer by thermal spraying.

6. The bi-layer coating of claim 5, wherein the thermal spraying comprises thermal spraying of one or both of nanometer and micrometer size particles.

* * * * *